United States Patent [19]
Friedl et al.

[11] Patent Number: 5,537,652
[45] Date of Patent: Jul. 16, 1996

[54] DATA FILE DIRECTORY SYSTEM AND METHOD FOR WRITING DATA FILE DIRECTORY INFORMATION

[75] Inventors: Theodore J. Friedl, Madison, Wis.; Leon E. Gregg, Rochester, Minn.; Larry W. Loen, Rochester, Minn.; Randy K. Rolfe, Rochester, Minn.

[73] Assignee: International Business Machines Corporation, Armonk, N.Y.

[21] Appl. No.: 569,954

[22] Filed: Aug. 20, 1990

[51] Int. Cl.⁶ ................................................. G06F 12/06
[52] U.S. Cl. ........................... 395/438; 395/404; 395/419
[58] Field of Search .............................. 364/200 MS File, 364/900 MS File; 395/400, 425

[56] References Cited

U.S. PATENT DOCUMENTS

| | | | |
|---|---|---|---|
| 4,408,273 | 10/1983 | Plow | 395/600 |
| 4,536,837 | 8/1985 | Olson et al. | 395/600 |
| 4,575,827 | 3/1986 | Kulakowski | 365/230 |
| 4,682,318 | 7/1987 | Busby | 369/59 |
| 4,703,425 | 10/1987 | Muraki | 364/419 |
| 4,733,386 | 3/1988 | Shimoi | 369/59 |
| 4,742,450 | 5/1988 | Duvall et al. | 395/700 |
| 4,761,737 | 8/1988 | Duvall et al. | 395/725 |
| 4,791,623 | 12/1988 | Delotte | 369/59 |
| 4,792,936 | 12/1988 | Picard | 369/59 |
| 4,792,937 | 12/1988 | Picard | 369/59 |
| 4,825,354 | 4/1989 | Agrawal et al. | 364/200 |
| 4,827,462 | 5/1989 | Flannagan et al. | 365/49 |
| 4,912,629 | 3/1990 | Shuler, Jr. | 395/600 |
| 5,021,946 | 6/1991 | Korty | 395/600 |
| 5,088,033 | 2/1992 | Binkley et al. | 395/500 |

FOREIGN PATENT DOCUMENTS

| | | |
|---|---|---|
| 325823A1 | 8/1989 | European Pat. Off. |
| 0375188 | 11/1989 | European Pat. Off. |
| 8901663 | 2/1989 | WIPO |

OTHER PUBLICATIONS

"Inside Atari Dos", Bill Wilkinson, published by Compute! Books, Copyright 1982, pp. 10–14.

Microsoft Systems Journal Sep. 1989, New York, pp. 1–13, Ray Duncan, "Design Goals and Implementation of the New High Performance File System".

IBM Technical Disclosure Bulletin; D. D. Grossman, Updating Non-Erasable Storage, Jun. 1981, 775–776, vol. 24 No. 1B.

IBM Technical Disclosure Bulletin; W. J. Flannagan et al., Incremental Directory Indexes In A Write–Once Recording Environment, Mar. 1988, 344–350, vol. 30 No. 10.

Levy, J. A. & Wang, W.; A File Structure For Non-Erasable Media; 1988; 72–76; abstract.

*Primary Examiner*—Reba I. Elmore
*Attorney, Agent, or Firm*—Philip M. Kolehmainen; Owen J. Gamon; Pryor A. Garnett

[57] ABSTRACT

A data storage medium having the ability to recover from media errors includes a directory located at any desired region of a data storage area with redundant directory pointers at reserved locations. A unique file token is included in the directory entry for each data file and is also included in each extent list where the locations of parts of a fragmented data file are stored. Multiple extent lists are chained in two directions to facilitate reconstruction of the chain if part of the pointer information is lost.

8 Claims, 4 Drawing Sheets

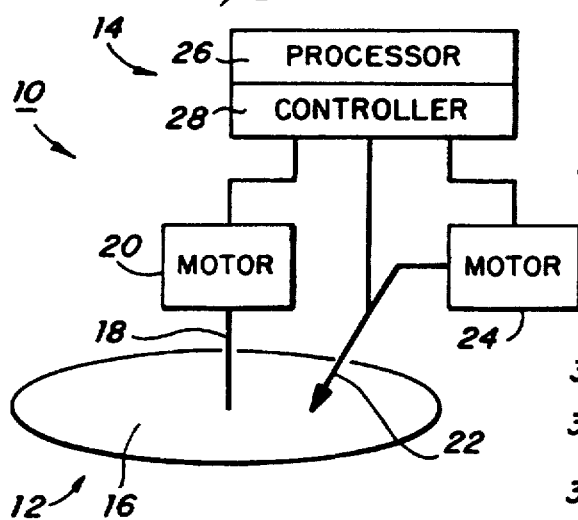
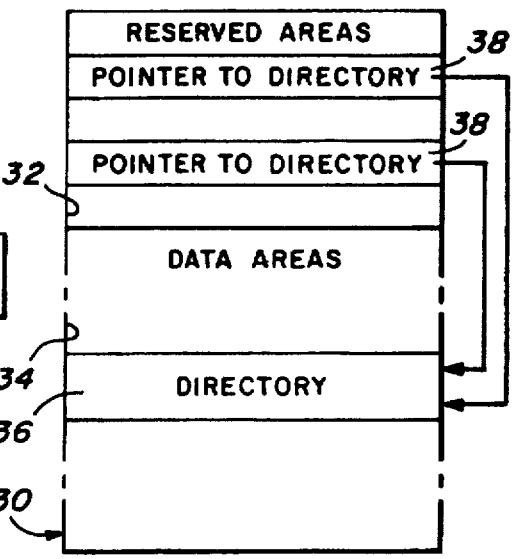
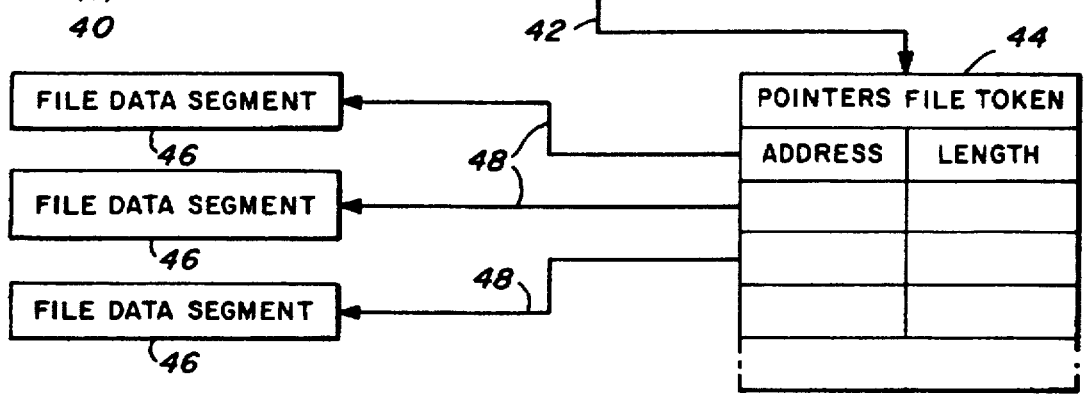
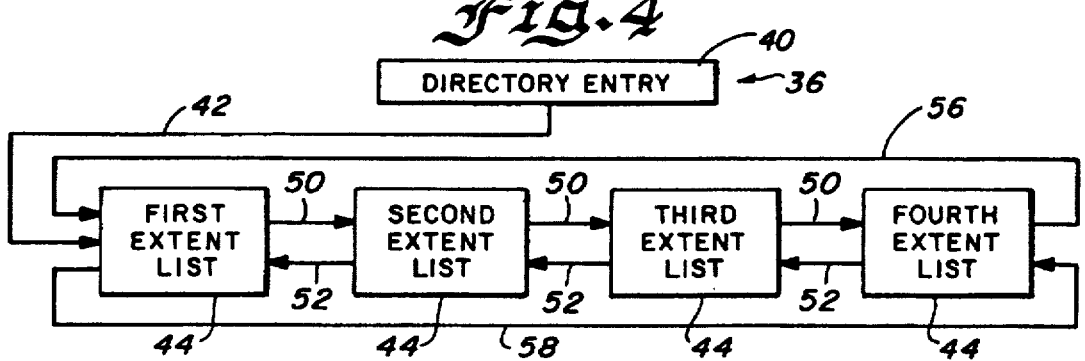

DATA FILE DIRECTORY SYSTEM AND METHOD FOR WRITING DATA FILE DIRECTORY INFORMATION

FIELD OF THE INVENTION

This invention relates to directories of data files written on data storage media, and more particularly to directory structures and methods improving the ability to overcome media failures and recover data files stored on a medium.

DESCRIPTION OF THE PRIOR ART

Computers often include memory storage units having media on which data can be written and from which data can be read for later use. Among the types of media that have been used are magnetic disks and tape and optical disks of both the noneraseable, write once, read many (WORM) type and of the erasable type in which data can be overwritten.

Information of many types, all known as data, is stored on a medium in groups called data files. The medium is typically subdivided in a formatting process into numerous segments or sectors or clusters each having a logical address. Often certain ones of the sectors are reserved for specific uses by the operating system and the remaining sectors are available for the storage of data files. Data files are written to available sectors of the medium, and a directory list or table is maintained on the medium so that the data files can be located for subsequent reading. It is conventional to locate the directory at a predetermined place in the reserved part of the medium so that the directory can be accessed quickly at its known location.

It is inefficient always to write data files in contiguous sectors of the medium, and often files are fragmented. Fragmentation occurs when blocks of data from the file are written to available discontinuous sectors at different locations of the medium. Normally one or more lists are maintained of the addresses of the fragments of a file, and a directory entry for the file provides a pointer to the address of the lists. If more than one list is required, a pointer is typically provided within each list to the address of the next sequential list.

As data storage technology advances, the sizes of data storage media is increasing. It is not unusual for a data storage unit to have a capacity of hundreds of megabytes or more. Although large storage capacities are desired, problems of data loss due to media faults increase. Commonly, a small part of the sectors of a data storage medium contain media faults that make those specific sectors unusable because they cannot reliably store data. During formatting, these faulty sectors are flagged and are not used. If the faulty sectors are in the data storage area of the medium, this presents little problem. But if a faulty sector resides in the area reserved for the directory, then the entire medium may not be useable.

Serious problems can also result when sectors become faulty during use of the medium because data stored on the medium may become lost. The large capacity of the medium may discourage the practice of making duplicate back-up copies of data, making the risk of data loss even more grave. If a faulty sector develops in the directory, the operating system may be unable to read the directory and the pointer to the lists of fragments of a file can be lost. It can then be impossible to reconstruct the file. If a fault develops in the pointers written in the lists, the chain of pointers can be broken and a fragmented data file may be difficult or impossible to reassemble.

SUMMARY OF THE INVENTION

Among the important objects of the present invention are to provide a method and a data storage medium in which the risk of data loss due to media faults is reduced; to provide a method and a medium in which faulty sectors in a reserved directory area are not likely to make the medium unusable; to provide a method and a medium in which a fragmented data file can be reassembled even if the directory entry cannot be read; to provide a method and a medium in which a chain of lists of fragments of a file can be used even if a pointer in the chain is lost; and to provide methods and media structures overcoming disadvantages of those used in the past.

In brief, a data storage medium and method of the present invention includes a directory table written on the medium and a data storage area on the medium including numerous defined segments on which blocks of data can be written. There is an address for each defined segment. A fragmented data file includes blocks of data written on discontinuous segments. A directory entry is written in the directory table for the data file containing a unique file identifier. A list is written on the medium containing addresses of written segments of the data file. A pointer written in the directory entry points to the list and the unique file identifier is written in the list. If multiple lists relate to the data file, each includes the unique file identifier.

In brief, the present invention also provides a method of arranging and finding data file directory information on a data storage medium having a data storage area with addressable locations. At least two specific regions of the medium are dedicated for directory address information. A file directory is stored at any selected location within the data storage area of the medium. A pointer is written in each of the dedicated regions pointing to the address of the location selected for the file directory. The file directory is found by reading the pointer from one of the dedicated regions.

In brief, in accordance with another aspect of this invention, a method of storing information about fragments of a data file on a processor addressable data storage medium is performed by listing the addresses of the fragments of the data file in a series of extent lists. In each list a pointer is written to the address of the sequentially next list in the series and a pointer is written to the address of the sequentially previous list in the series.

BRIEF DESCRIPTION OF THE DRAWINGS

The invention together with the above and other objects and advantages may be best understood from the following detailed description of the embodiment of the invention shown in the accompanying drawings, wherein:

FIG. 1 is a schematic and block diagram of a computer or data processing system having a data storage medium embodying the present invention;

FIG. 2 is truncated block diagram of the data storage medium of FIG. 1;

FIG. 3 is a truncated block diagram of parts of the directory information portions of the medium of FIG. 2;

FIG. 4 is a block diagram of a directory entry and extent list of the medium of FIG. 2;

DETAILED DESCRIPTION OF THE INVENTION

Figure 5:
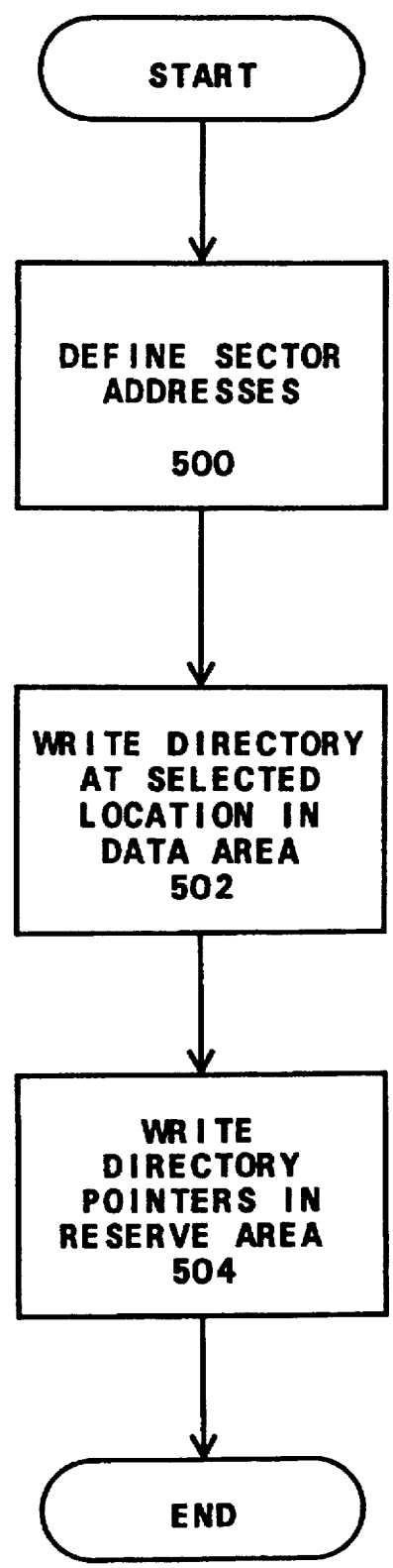
FIG. 5 is a logic flow diagram illustrating sequential steps for implementing the directory location and directory pointers in accordance with the invention.

In FIG. 1 there is shown a partly schematic block diagram of parts of a computer data processing system 10 including a data storage medium generally designated as 12 and a data utilizing device generally designated as 14. In the preferred embodiment of this invention, the medium 12 is embodied in a disk 16 that is rotated about its axis 18 by a disk drive motor 20, although other configurations such as tape or matrixed memory arrays of various kinds may be used. Disk 16 may be of the magnetic or optical type, and may be erasable or WORM in operation.

The data storage area of the disk 16 is subdivided into numerous functionally indivisible minimum data areas, each of which is individually addressable and can contain one block or quantum of stored information. On a disk medium, the minimum data areas, called sectors, are arrayed in a pattern around the axis 18. The sectors can be accessed by a read/write head 22 movable radially with respect to the rotating disk 16 by a head drive motor 24 selectively into registration with any of the numerous data areas.

Data utilization device 14 typically includes a processor 26 that generates or receives and passes data to be stored in the data areas of disk 16 for subsequent access and use. A disk controller 28 is coupled between the processor 26 and the motors 20 and 24 and the head 22. The disk controller 28 controls the operations of moving the head into registration with selected data areas, writing data to the data areas, reading data from the data areas, sensing status and others, all under the control of the processor 26. More than one disk 16 using one or both sides accessed by more than one read/write head 22 may be used for increased capacity if desired.

FIG. 2 is an illustration of the entire region 30 of disk 16 onto which data can be written. During a formatting operation or the like, the sectors of the region 30 or clusters of those sectors are provided with logical addresses (block 500 in FIG. 5) so that they can be written to and read from by the head 22. The region 30 is divided into a reserved area 32 and a data area 34. In the reserved area, information required by the controller 28 or processor 26 is written in known, predetermined locations. This information can be located for use by the controller 28 without searching the entire region 30 and without reference to directory information written on the medium 12. Data area 34 includes those sectors that are available for the storage of data received from the processor 26 through the controller 28.

Data is written onto the area 34 in the form of data files. A directory table or list 36 is maintained so that files can be located. In accordance with a feature of the present invention, the directory 36 is written on the data area of the region 30 (block 502 in FIG. 5) rather than on the reserved area 32. Directory 36 can be placed in any desired location in area 34 and, as a result, the medium is not rendered unusable by media faults in a reserved directory address in the reserved area 32. Because the location of the directory 36 is not predetermined, the present invention provides a way for it to be located quickly. A pair of pointers 38 are written onto the reserved area 32 at predetermined locations (block 504 in FIG. 5). The use of redundant pointers 38 makes it highly unlikely that the medium 12 will be unusable due to media faults in both pointer locations, and makes it highly unlikely that later media faults can result in loss of the directory 36 due to the development of faults in the reserved area 32.

Figure 6:
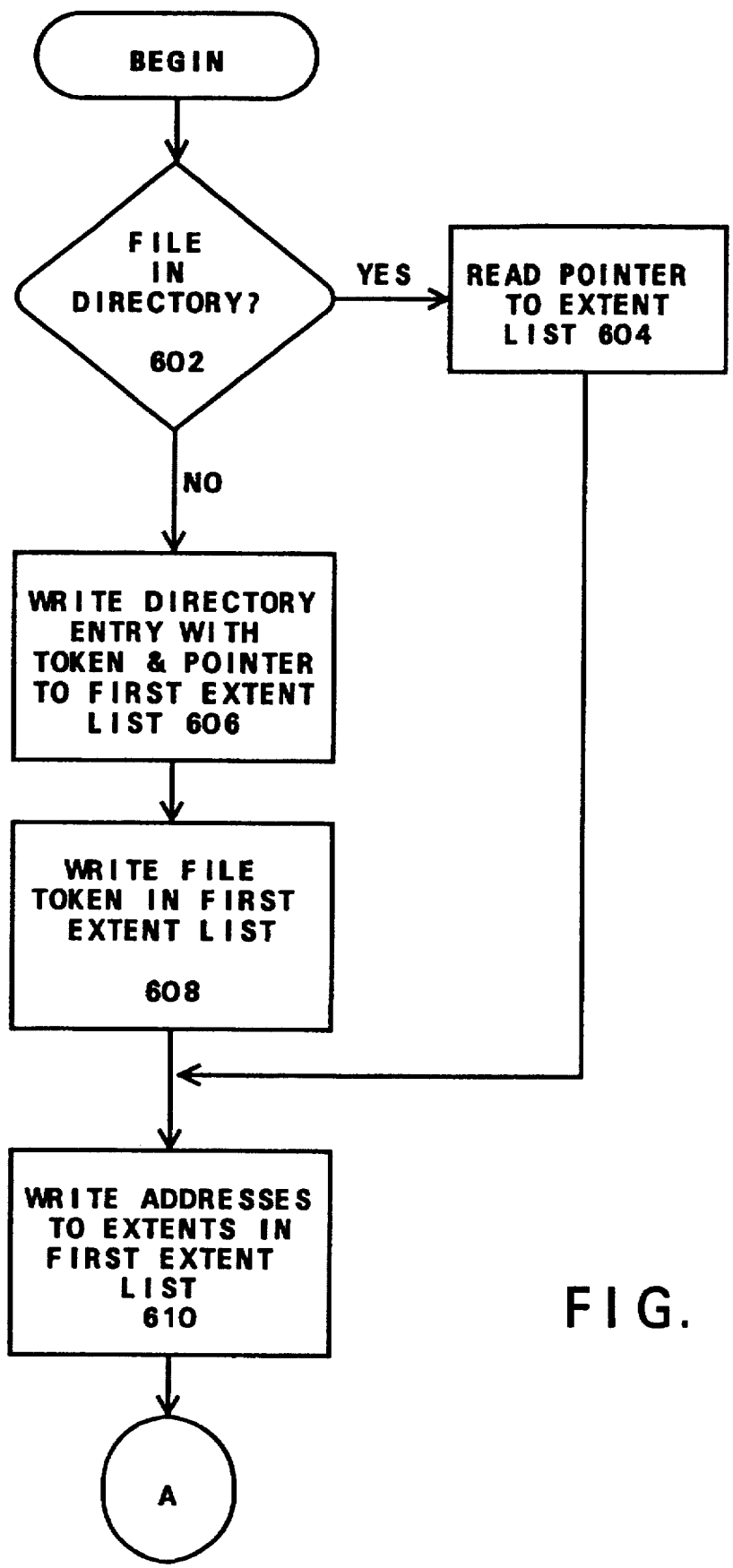
FIGS. 6 and 7 are logic flow diagrams illustrating sequential steps of the method of writing directory entries and extent lists in accordance with the invention.

When a data file is written on the data area 34 of the medium 12 (block 600 in FIG. 6), numerous sectors may be required. Often the data file is fragmented and written at discontinuous locations. The fragments or their locations are called extents. To read the data file, each of the extents must be located. Although a list of all of the locations could be included in the directory 36, this could cause the directory to increase to an undesirable size and the more usual practice is to list the fragments or extents separately.

As seen in FIG. 3, the directory 36 is a table or list of a number of directory entries 40 (block 602 in FIG. 6), each containing information about one data file that is stored onto medium 12. This information includes a file name, file attributes and other data. Fragments or extents 46 of one data file are seen in FIG. 3. Because it is not desired to list all the locations of extents 46 of the data file in the directory 36, the corresponding directory entry 40 includes a pointer 42 to the address of an extent list 44 associated with the data file (blocks 604, 606 in FIG. 6). The extent list 44 includes a pointer 48 to the address of each extent 46 (block 610 in FIG. 6) and also includes information about the length or size of the extent. In other arrangements, each cluster or segment may be listed rather than listing the start address and size.

The extent list 44 is allocated on the medium 12 as an area having a predetermined size. If the number of fragments or extents 46 is large (block 700 in FIG. 7), additional extent lists 44 are used as illustrated in FIG. 4. Each of the extent lists is written onto the data area 34 of the medium 12 in available sectors or clusters as needed. Thus the extent lists of a single data file are likely to be discontinuous and located at different places on the medium 12.

It is possible that all or part of the directory 36 can be lost to a media fault after the extents 46 and extent list or lists 44 are written. In order to avoid loss of the data in the stored data file, a file token is written in the directory entry 40 and is also written in each extent list 44 (block 608 in FIG. 6) associated with the data file. The token may be the file name if the operating system precludes duplicate names, but more typically is a number that is unique to one file. The token is assigned when the file is created or when it is first written on the medium 12, and does not change thereafter. Because the unique file token is included in each extent list 44, the extent lists can be found and associated with the file even if the information in the directory file is unavailable.

Figure 7:
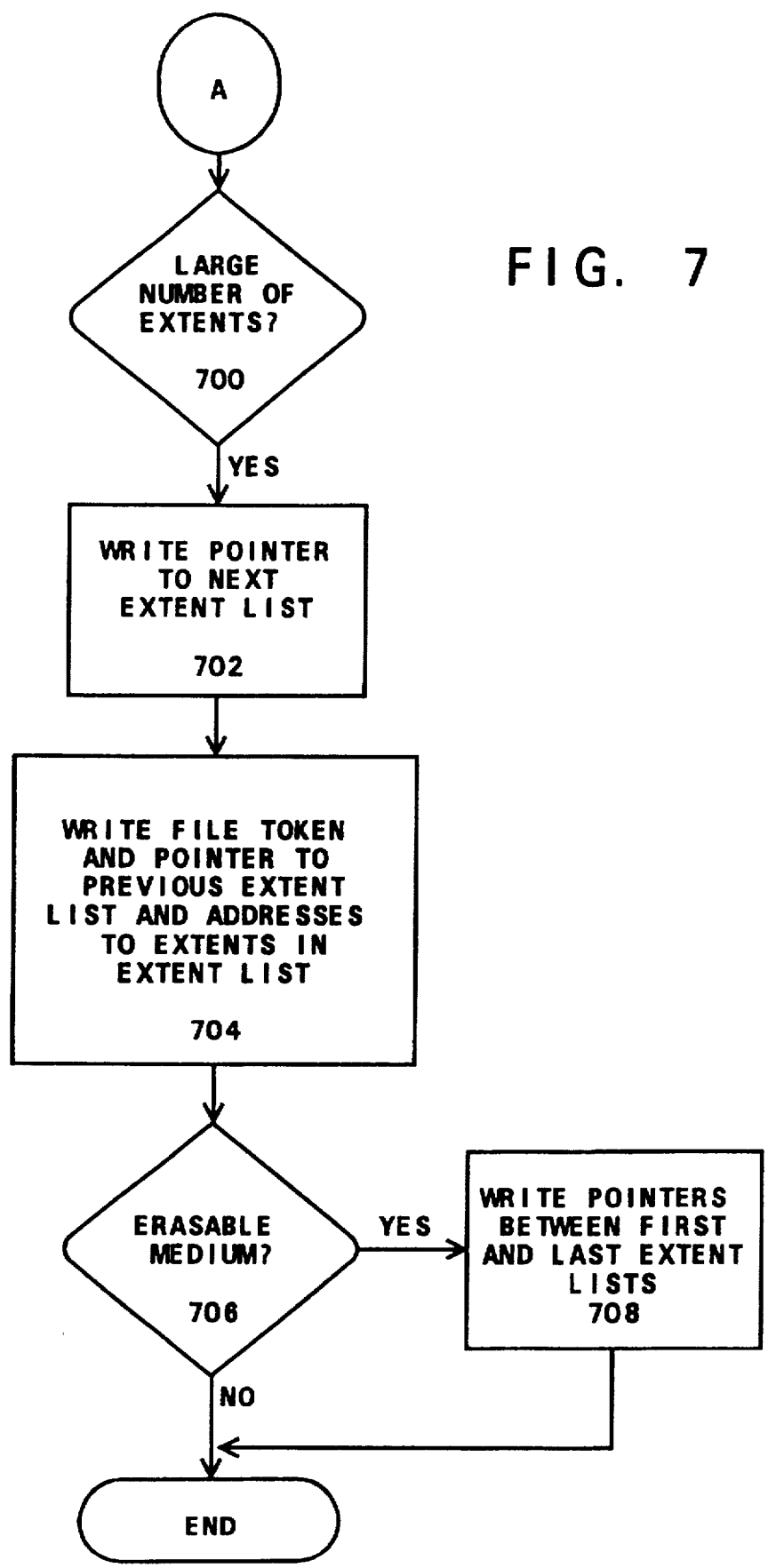

When additional extent lists are added to the first extent list 44, a pointer 50 is written pointing to the address of the next added extent list (block 702 in FIG. 7). The pointers 50 link the sequence of lists 44 in a chain. In accordance with the invention, when a list 44 (block 704) is added, it also includes a pointer 52 pointing in the opposite direction to the previous list 44 (block 704 in FIG. 7) resulting in a double or bidirectional chain. In addition, where the nature of the medium 12 permits erasing and overwriting of data (block 706), the extent lists 44 are linked in an endless chain by additional bidirectional pointers 56 and 58 linking the ends of the chain (block 708 in FIG. 7) as seen in FIG. 4.

If a media fault causes loss of pointer information at one point in the chain, the extent list may be reconstructed. All readable elements of the list can be placed in the proper order by following the pointers 50 in one direction and following the pointers 52 in the other direction. The unreadable piece of the chained lists can be unambiguously identified. Even if some of the extent information is lost, the data file may be reconstructed using the information that can be obtained from the use of the file tokens, the bidirectional pointers 50 and 52 and the location of data file fragments 46 that are not part of other files.

We claim:

1. A directory system for data files stored on a data storage medium on which data is written and from which data is read by a read/write means under the control of processor means, said directory system comprising:

means for writing a directory table at a selected location in a data storage area on the medium;

said data storage area including numerous defined segments on which blocks of data can be written;

means for defining an address for each defined segment;

means for writing a fragmented data file including blocks of data disposed at discontinuous segments of said data storage area;

means responsive to said fragmented data file writing means for writing a directory entry in said directory table for said data file, said directory entry containing information about said file, including a unique file identifier and including a pointer pointing to a selected list location in said data storage area for a list;

means responsive to said directory entry writing means for writing said list at said selected list location in said data storage area on the medium containing addresses of said written segments of said fragmented data file;

said unique file identifier being included in said list; and means for writing a plurality of directory pointers on the medium each containing a directory list pointer to the address of said directory table.

2. A directory system for data files as claimed in claim 1 further comprising means responsive to a predetermined number of addresses of said data segments being written by said list writing means for writing at least one additional list on the medium containing addresses of additional segments of said fragmented data file, each said additional list including said unique file identifier.

3. A directory system for data files as claimed in claim 2 further comprising means for chaining said lists.

4. A directory system for data files as claimed in claim 3, wherein said chaining means include means for writing list pointers in each of said lists pointing to a next of said lists.

5. A directory system for data files as claimed in claim 3, said chaining means include means for writing list pointers in at least some of said lists pointing to a next of said lists and pointing to a prior of said lists.

6. A directory system for data files as claimed in claim 1 further comprising a reserved area on the medium from which blocks of data of said data file are excluded, and wherein said directory pointers writing means being controlled for writing said directory pointers on said reserved area.

7. Apparatus for writing data file directory information on a storage medium having a plurality of discrete locations defined in the storage medium and each of said discrete locations having an address, and said discrete locations including data storage locations available for data files and reserved system locations unavailable for data file storage, said apparatus comprising:

means for writing a file directory at a selected at least one of said data storage locations on the medium, said file directory containing an identification of and information about the addresses of data files in the data storage locations; and means for writing a pointer at least at two different ones of said reserved system locations, said pointers pointing to the address of a data storage location where said filed directory is stored.

8. A method of arranging and finding data file directory information on a data storage medium on which data is written and from which data is read by a read/write means under the control of processor means, said data storage medium having a processor addressed data storage area and predetermined reserved regions, said method comprising the steps of:

storing a file directory at a selected location within the data storage area of the medium;

writing a pointer in at least two predetermined reserved regions separate from the data storage area of said medium pointing to the address of the location selected for the file directory; said directory pointer being used for finding the file directory by reading the pointer from one of said reserved regions.

* * * * *